United States Patent [19]

Zola

[11] Patent Number: 4,869,768

[45] Date of Patent: Sep. 26, 1989

[54] ULTRASONIC TRANSDUCER ARRAYS MADE FROM COMPOSITE PIEZOELECTRIC MATERIALS

[75] Inventor: John J. Zola, Ramsey, N.J.

[73] Assignee: North American Philips Corp., New York, N.Y.

[21] Appl. No.: 219,520

[22] Filed: Jul. 15, 1988

[51] Int. Cl.⁴ ............................................. B29C 43/02
[52] U.S. Cl. ..................................... 156/245; 156/252; 156/257; 156/267; 29/25.35; 84/DIG. 24; 252/62.9; 310/311; 310/358; 310/367; 310/371
[58] Field of Search ................ 156/84, 245, 252, 257, 156/267; 29/25.35; 252/62.9; 264/156; 84/DIG. 24; 310/311, 334, 358, 366, 367, 371

[56] References Cited

U.S. PATENT DOCUMENTS

| | | | |
|---|---|---|---|
| 4,250,603 | 2/1981 | Luft | 29/25.35 |
| 4,281,550 | 8/1981 | Erikson | 310/367 |
| 4,658,176 | 4/1987 | Nakaya et al. | 310/358 |
| 4,683,396 | 7/1987 | Takeuchi et al. | 310/358 |
| 4,692,654 | 9/1987 | Umemura et al. | 310/366 |
| 4,788,096 | 11/1988 | Kalnin et al. | 84/DIG. 24 |

FOREIGN PATENT DOCUMENTS

| | | | |
|---|---|---|---|
| 242800 | 12/1985 | Japan | 29/25.35 |
| 1235431 | 10/1987 | U.S.S.R. | 29/25.35 |

*Primary Examiner*—Caleb Weston
*Attorney, Agent, or Firm*—William L. Botjer

[57] ABSTRACT

A method for providing a curved composite ultrasound transducer of a relatively large size. A blank of piezoceramic material has its rear side reticulated with a series of relatively coarse grooves. The front side of the material is reticulated with a series of relatively deep fine grooves to provide a matrix of upstanding piezoceramic rods. The spaces between the rods on the front side of the blank are therefore filled with a curable polymeric resin (epoxy). The resin filling the blank spaces on the front side is partially cured. After partial curing, the blank is placed into a spherical compression mold and molded so that its front side is formed concave and its rear side convex. The resin is cured while holding the molded blank under pressure in the mold until the resin has cured. After curing, the blank is removed from the mold and the back side is ground away to provide a spherically curved transducer having a multiplicity of individual piezoceramic rods disposed in a matrix of cured resin.

8 Claims, 1 Drawing Sheet

ULTRASONIC TRANSDUCER ARRAYS MADE FROM COMPOSITE PIEZOELECTRIC MATERIALS

BACKGROUND OF THE INVENTION

This invention relates to a method for fabricating composite materials. More particularly, the invention relates to a method for fabricating a curved composite ultrasound transducer. The method of fabrication permits the fabrication of curved ultrasonic transducers in large sizes. Such transducers are particularly useful in medical ultrasound diagnostic apparatus.

Transducers for ultrasonic diagnostic equipment are commonly fabricated from a single block of the piezoelectric ceramic lead zirconate titanate (PZT), however, other ceramics such as lead titanate and lead metaniobiate and certain polymers such as PVDV may also be used. Recently, composite piezoelectric materials constructed from a matrix of PZT rods disposed in a polymer have been developed. Such composite transducers have provided greater freedom of design in transducers. The term "composite transducer" as used herein describes a transducer which includes regions of an electrically active material (i.e. a piezoelectric material) which are embedded in a matrix of a second material. Preferentially, the second material is an electrically passive material (i.e. an insulator). The second material may have acoustic properties which are different from the acoustic properties of the active material.

Many composite transducers are manufactured in the form of flat discs. However, for certain applications in medical diagnostic ultrasound a curved focused transducer is desirable. However, the fabrication of a curved composite transducer has presented difficulties. One attempt to overcome these difficulties has been to fabricate the composite transducers from a polymer, such as polyurethane, which is extremely flexible, see e.g. the polyurethane composite transducers described in "Ultrasonic Probe Using Composite Piezoelectric Materials' IEEE Ultrasonic Symposium 1985 at pages 634–636 and "Medical Ultrasonic Probe Using PZT/Polymer Composite' described at Vol. 3 of the papers presented at the second "U.S./Japan Seminar on Dielectric and Piezoelectric Ceramics', Nov. 4–7, 1984. However, ultrasonic transducers fabricated from flexible polyurethane materials have been found to be less completely satisfactory.

Another method of forming a curved composite transducer is discussed in "1985IEEE Transactions on Sonics and Ultrasonics", Vol. SU-32 at page 499–513, in an article entitled "Piezoelectric Composite Materials for Ultrasonic Transducer Applications. Part II: Evaluation of Ultrasonic Medical Applications." In this article a composite transducer was manufactured from a relatively low viscosity epoxy which was molded into a curved shape by heating the already cured epoxy to a point above its glass transition temperature until it softened and bent. However, this approach has been found less than completely satisfactory, because large diameter transducers cannot be made due to the high shrinkage of the low viscosity epoxy resin. As the effect of shrinkage is proportional to the size of the transducer, the shrinkage builds up in a larger diameter transducers rendering them unusable. Higher viscosity epoxy is not usable in this method because it is thermosetting and will not deform under heat.

Another method for forming a curved composite ultrasonic transducers has been to grind concave and convex surfaces onto a flat composite transducer. However, only relatively shallow radius transducers are capable of being made by this method as the thickness of the composite block is limited by the depth of the groove that can be cut in order to produce the block by the dicing and filling method. PZT rods can be cut only to relatively short lengths and thus the amount of curvature achievable by grinding curved surfaces is quite limited. Furthermore, PZT/polymer composites can only be made in relatively thin sections.

The present invention is directed to overcoming these problems and provides curved composite epoxy/PZT transducers of large size having excellent electromechanical properties.

SUMMARY OF THE INVENTION

The invention is directed to a method for providing a curved composite ultrasound transducer of a relatively large size. A blank of piezoelectric material has its rear side reticulated with a series of relatively coarse grooves. The front side of the material is reticulated with a series of relatively deep fine grooves to provide a matrix of upstanding piezoelectric rods. The spaces between the rods on the front side of the blank are filled with a curable polymeric resin (epoxy) which is thereafter partially cured. After partial curing, the blank is placed into a spherical compression mold and formed under pressure so that its front side is concave and its rear side convex. The resin is cured while holding the molded blank under pressure in the mold until the resin has cured. After curing, the blank is removed from the mold and the back side is ground away to provide a spherically curved transducer having a multiplicity of individual piezoelectric rods disposed in a matrix of cured resin. The front side is ground to remove excess epoxy from the rod ends and to correct small errors in curvature.

BRIEF DESCRIPTION OF THE DRAWINGS

For a better understanding of the invention, reference is made to the following drawings which are to be taken in conjunction with the detailed description of the invention to follow, in which.

DESCRIPTION OF THE PREFERRED EMBODIMENTS

Figure 1:
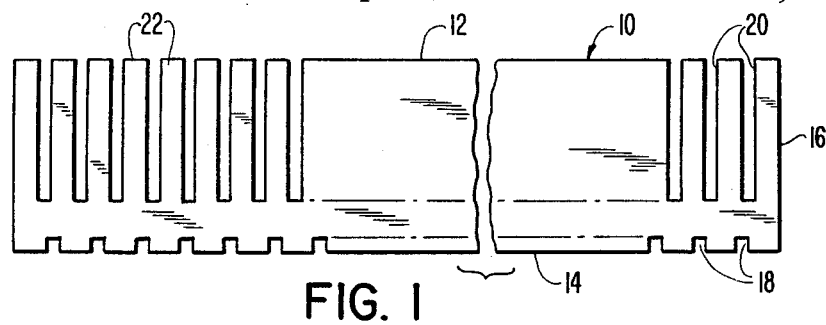
FIG. 1 is a sectional view of the blank of piezoelectric material from which the transducer is to be formed with the reticulations cut into the front and rear surfaces.

FIG. 1 illustrates the blank 10 of PZT material used to form the finished piezoelectric transducer. Blank 10 is in the form of a cylindrical disc and includes a front side 12, a rear side 14 and a sidewall 16. Blank 10 may be any suitable piezoelectric material such as a ceramic. A small grain high density material is particularly suited to making the fine composite structure needed for the finished transducer. Preferably, front side 12 of blank 10 is lapped in order to eliminate any microscopic surface cracks which may have damaged the ceramic.

Since blank 10 will ultimately be molded into a compound curve during the compression molding process, portions of the blank will crack when molded. Accordingly, in order to ensure that blank 10 cracks in a uniform manner its rear side 14 is reticulated with a series of grooves 18. Grooves 18 are cut in rear side 14 with a fine diamond saw. First a series of parallel cuts are made in the rear side 14 of blank 10. Thereafter blank 10 is rotated 90° and a further series of parallel cuts are made in rear side 14 of blank 10.

Accordingly, rear side 14 of blank 10 is "diced" by means of perpendicular grooves 18. The dicing on rear side 14 is relatively shallow in comparison with the cuts to be made in front side 12 of block 10. By way of example only, a sufficient grooving on rear side 14 is 0.2 mm deep cuts spaced 2 mm apart and having a cut width of 0.075 mm. The depth, pitch and position of grooves 18 on rear side 14 need not bear any particular relationship to the grooves on front side 12 as the rear side groove 18 merely permit blank 10 to crack evenly upon molding and the entire rear side 14 of blank 10 will ultimately be completely ground away.

After rear side 14 has been reticulated, the front side 12 will be reticulated with a series of perpendicular deep, finely pitched cuts 20. For example only, Cuts 20 may be spaced at a pitch of 0.15 mm, have a cut width of 0.075 mm and be 0.9 mm deep. As with rear side 14, front side 12 is first cut with a fine diamond saw in a series of parallel cuts. Thereafter, blank 10 is rotated 90° and another series of cuts is made, perpendicular to the first series of cuts. This will provide a series of ceramic rods upstanding from blank 10 with each rod approximately 75 by 75 by 900 micrometers in length. These rods will be all that remains of the PZT material when the transducer is completed.

The next step in the present method is the filling of the grooves 20 with a curable polymeric resin (epoxy) and is accomplished with the aid of a centrifuge. A suitable epoxy for this application is a high viscosity, low shrinkage epoxy. It has been found that the viscosity of the epoxy is inversely proportional to its shrinkage. That is, a high viscosity epoxy will have low shrinkage which is an important factor when forming a curved transducer of relatively large diameter. However, since the epoxy has a high viscosity it will not fill grooves 20 by itself. Accordingly, a centrifuge is used to fill the grooves with epoxy. The front side 12 of blank 10 is coated with epoxy and then placed in a centrifuge with rear side 14 facing outwardly in the centrifuge. When the centrifuge rotates the epoxy resin is drawn into grooves 20. The resin should cover the tops of rods 22. After the epoxy has been disposed within grooves 20, the epoxy is partially cured by letting the epoxy filled blank 10 stand at room temperature. When only partially cured, the epoxy resin will flow during compression molding.

Figure 2:
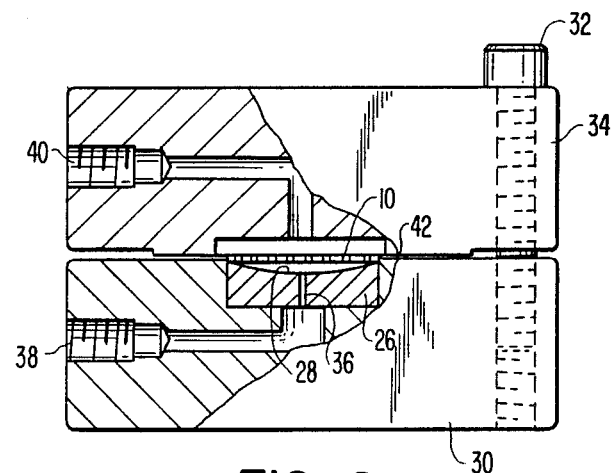
FIG. 2 is a sectional view of the compression molding apparatus for forming the curved transducer.

FIG. 2 illustrates the apparatus for the compression molding of blank 10. Blank 10 is disposed above a die 26 having a spherical concave depression 28. Die 26 is held in a lower die holder 30 which is joined by a fastener 32 to an upper die holder 34. Die 26 includes an air inlet 36 which is coupled for fluid communications to a pressure inlet 38 in lower die holder 30. Upper die holder 34 includes an upper pressure inlet 40. As shown in FIG. 2, epoxy filled transducer 10 is disposed above die 26 and is covered with a thin rubber diaphragm 42.

Upper pressure inlet 40 is connected to an air (or other fluid) line which admits a pressure of approximately 80 psi. The pressure on diaphragm 42 forces transducer blank 10 to bend down along the contour of the die 26. The transducer blank 10 is allowed to remain in the mold under pressure for 24 hours which will permit the epoxy to fully cure. Bubbles trapped in the epoxy resin can be removed by admitting 80 psi to lower die pressure inlet 38 with the pressure to the upper die inlet 40 simultaneously raised to 160 psi. After remaining in die 26 for 24 hours, the epoxy will fully cure and the transducer will remain curved when pressure is removed. After removal from the die 26, the transducer may be given a post curing treatment at elevated temperature to develop the full properties of the epoxy resin. The molded transducer is now ready for grinding.

After removal from die 26 the transducer will have a concave spherical front surface 12 and a convex rear surface 14. Rear surface 14 will have cracked along grooves 18 and rear surface 14 will have a number of rectangular blocks of piezoelectric material between perpendicular grooves 18. Extending from the blocks are rods 22 which are now arranged so that they point towards the focal point of transducer 10. In order to complete the transducer, the rear portion 14 of transducer 10 is ground away and the excess epoxy extending above rods 20 on concave front face 12 must also be ground away.

Figure 3:
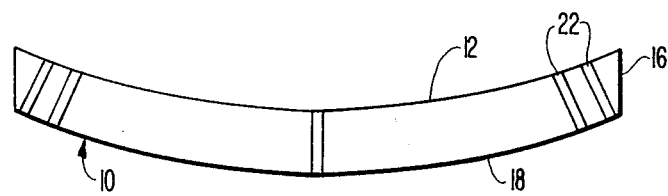
FIG. 3 is a sectional view of the completed curved piezoelectric transducer.

The grinding of transducer 10 may be accomplished by hand grinding against curved laps or in a lens generating machine. The rear convex side is ground to the appropriate radius until all of the blocks formed by the cracking along perpendicular grooves 18 are removed, leaving only rods 22 upstanding in the matrix of epoxy. Similarly, front surface 10 is ground away until the tops of the rods 22 are flush with the top surface. Accordingly, the completed transducer is shown in FIG. 3 in which each rod 22 is separate from the others and is dispersed in a spherically curved matrix of epoxy. Thereafter the edges of transducer 10 may be ground into the appropriate cylindrical shape, by for example, a rotary edge grinder.

After completion of the grinding, electrodes are deposited on both sides of transducer 10 by any suitable method such as thermoevaporation. The electrodes also can be deposited by sputtering or other known metal deposition methods. The convex rear side electrodes are cut through by scribing to form annular ring electrodes. Such scribing may be accomplished on a small engine lathe and cut with a cutting tool. The number of electrodes may vary depending upon the type of transducer required, after scribing each of the electrodes on the convex rear side 14 are electrically isolated from each other. Finally, an acoustic matching layer may be applied to the concave forward surface 12. The acoustic matching layer may be any suitable material with a suitable acoustic impedance, such as epoxy which may be applied to front surface 10 and cured as appropriate.

EXAMPLE

A spherically curved piezoelectric composite transducer was manufactured from a Honeywell 278 ceramic disc of 22 mm diameter by 1.5 mm thickness. The disc was lapped to 1.2mm thickness before cutting. The rear side was reticulated with a series of 0.075 mm wide slots spaced 2mm apart and 0.2mm deep. Thereafter, the blank was rotated and a second series of identical perpendicular grooves was cut in the rear surface of the block. The front surface of the blank was diced with 0.075 wide grooves which were 0.9 mm deep at a pitch of 0.150. The slots were cut with a rotary diamond blade.

The epoxy used to fill the grooves on the front surface was Stycast No. 2057 epoxy which has a viscosity of 3500 cps. The epoxy was mixed 100 parts by weight of Stycast No. 2057 resin with seven parts by weight of catalyst No. 9. A centrifuge was used to fill the grooves and thereafter the epoxy was partially cured for four hours at room temperature. The partially cured transducer was compression molded to a 70mm radius of curvature with 80 psi pressure. The epoxy was left to cure in the mold for 24 hours. After removal from the die, the transducer was given a four hour post-cure at 80° C. Thereafter the rear surface of the transducer and the front surface was ground to the appropriate dimensions. Gold electrodes were deposited on the front surface and a matching layer of Araldite 502 epoxy was used as the acoustic matching layer.

The transducer was operated at 3 MHz and was found to have high electro-mechanical coupling ($k_t = 0.57$) and low acoustic impedance (12 Mrayl). The transducer produced is an efficient broadband transducer particularly suited for medical imaging. The array elements, defined by the electrode pattern alone, exhibit low cross-coupling between adjacent elements. Good lateral resolution over a large range of depths can be achieved when used with electronically swept focusing. The transducer manufactured by the above described process also demonstrated proper impulse response.

Although the present invention has been described in conjunction with a preferred embodiment, it is to be understood that modifications and variations may be resorted to without departing from the spirit and scope of the invention, as those skilled in the art will readily understand. Such modifications and variations are considered to be within the purview and scope of the invention and the appended claims.

What is claimed is:

1. A method for fabricating a piezoelectric composite transducer comprising the steps of:
    providing a blank of piezoelectric material, said blank having a front side and a rear side;
    reticulating the rear side of said blank with a series of grooves;
    reticulating the front side of said material with a series of relatively deep grooves to provide a matrix of upstanding piezoelectric rods;
    filling the spaces between the piezoelectric rods on the front side of said blank with a curable polymeric resin;
    partially curing said resin filling the spaces between said rods on the front side of said blank;
    compression molding said blank into a curve, with said front side being concave and said rear side being convex;
    curing said resin while holding said molded blank in said curved shape until said resin has cured; and
    removing said back side of said blank to provide a spherically curved transducer having a multiplicity of individual piezoelectric rods disposed in a matrix of cured polymeric resin.

2. The method for fabricating a composite transducer as claimed in claim 1 further including the step of depositing electrodes on at least one of said front side and said rear side of said transducer.

3. The method for fabricating a composite transducer as claimed in claim 1 further including the step of disposing an acoustic matching layer on said front side of said finished transducer.

4. The method for fabricating a composite transducer as claimed in claim 1 wherein said reticulated front side of said blank is produced by cutting a series of perpendicularly disposed grooves in said front side.

5. The method for fabricating a composite transducer as claimed in claim 1 wherein the pitch of the reticulations of said rear side of said blank is substantially greater than the pitch of said reticulations of said front side.

6. The method for fabricating a composite transducer as claimed in claim 1 wherein the step of filling said grooves with said resin includes the step of centrifuging said blank to ensure the grooves of said blank are filled with said resin.

7. The method for fabricating a composite transducer as claimed in claim 1 wherein the depth of said reticulations of said front side are substantially greater than the depth of the reticulations of said rear side.

8. The method for fabricating a composite transducer as claimed in claim 1 wherein said curable polymeric resin comprises high viscosity, low shrinkage epoxy.

* * * * *